June 27, 1967 E. K. BRADY ETAL 3,328,694

BILATERAL TRANSMIT-RECEIVE FUNCTION DUAL
QUAD DIODE BRIDGE-OSCILLATOR FREQUENCY
TRANSLATOR CIRCUIT
Filed Oct. 1, 1964

INVENTORS
EUGENE K. BRADY
MARVIN M. GEHR

BY

Moody and Kintzinger

ATTORNEYS 3,328,694

BILATERAL TRANSMIT-RECEIVE FUNCTION DUAL QUAD DIODE BRIDGE-OSCILLATOR FREQUENCY TRANSLATOR CIRCUIT

Eugene K. Brady, Cedar Rapids, and Marvin M. Gehr, Council Bluffs, Iowa, assignors to Collins Radio Company, Cedar Rapids, Iowa, a corporation of Iowa Filed Oct. 1, 1964, Ser. No. 400,676
8 Claims. (Cl. 325—18)

Figure 1:
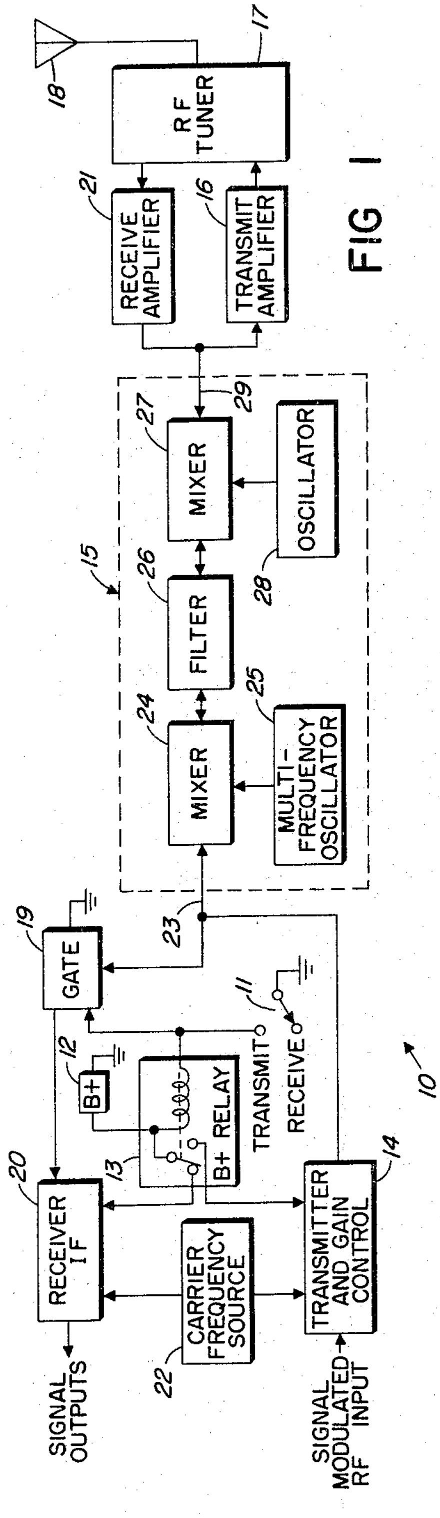

This invention relates in general to radio frequency tuning, and in particular to a bilateral function dual quad diode bridge dual oscillator frequency mixing circuit capable of translating an IF frequency by relatively small incremental frequency tuning steps.

With various radio frequency transceiver systems there are operational requirements from time to time that require finer tuning for both the transmit and receive modes of operation. It becomes important that various transceiver systems be provided with a finer incremental tuning capability by modification of existing equipments or basic equipment designs without changing the basic frequency schemes of such transceiver designs. With such modifications it is desirable that the frequency tuning system be limited to incremental tuning translation of IF frequencies. Furthermore, it is desirable that any zero-beat technique requirement for frequency correlation between transmitter and receiver of the system be avoided, and that the signal path be a bilateral transmit-receive signal path.

It is, therefore, a principal object of this invention to provide translation of IF radio frequencies by relatively small incremental frequency tuning steps.

Another object is to provide such incremental frequency step tuning with a bilateral transmit-receive function dual quad diode bridge dual oscillator fed frequency translator circuit.

Features of this invention useful in accomplishing the above objects include dual quad diode balanced mixers with frequency inputs respectively from dual oscillator frequency sources, one of which, or both, are capable of being switched through multiple frequencies by relatively small frequency incremental tuning steps. Transformer coupling is provided between the IF receiver and transmitter signal input portion and one of the diode quad balanced mixers, and a coupling transformer is provided between the other mixer and the RF tuner of the transceiver. A filter is also conveniently provided along with two additional signal coupling transformers interconnecting the dual quad diode balanced mixers. The respective oscillator frequency input connections are tap connections to coupling transformer windings directly connected to the respective quad diode balaced mixers.

A specific embodiment representing what is presently regarded as the best mode of carrying out the invention is illustrated in the accompanying drawing.

Figure 2:
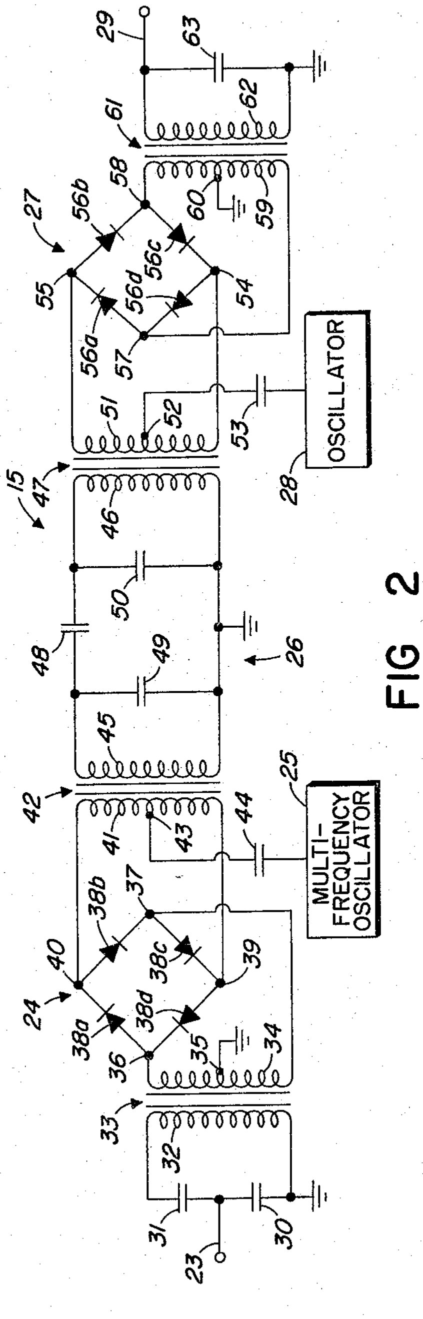

In the drawing:

FIGURE 1 represents a partial schematic of a transceiver system including a block schematic showing of the bilateral transmit-receive function dual quad diode bridge frequency translator circuit; and FIGURE 2, detail of the bilateral transmit-receive dual quad diode balanced mixer frequency translating circuit.

Referring to the drawing:

In the radio transceiver 10 of FIGURE 1, with switch 11 closed to transmit, B+ voltage from voltage supply 12 is supplied through relay 13 to the transmitter and gain control circuit 14 in order that a signal modulated IF input originating from transmitting equipment generally known to the art (not shown) may be passed through the transmitter and gain control circuit 14 to the dual quad diode mixer circuit 15. The signal modulated IF radio frequencies passed from the dual quad diode mixer circuit 15 through transmitter-amplifier 16 to RF tuner 17 are translated to an RF transmitting frequency in the tuner and transmitted from antenna 18.

Whenever the keying switch 11 is switched to the receive state, a receive gate 19 is open and the B+ relay 13 is thrown to switch B+ from transmitter and gain control circuit 14 to IF staging circuit 20 of receiver circuitry, generally known to those skilled in the art and not completely shown. In this receive mode of operation, RF signals received by antenna 18 at the tuned receiving frequency of RF tuner 17 are translated to a lower IF radio frequency in the tuner and passed to and through receive amplifier 21 to the dual quad diode mixer circuit 15. This results in an output from dual quad diode mixer circuit 15 being passed through gate 19 to receive IF staging circuit 20. A common carrier frequency source 22 is provided for supplying the carrier frequency insertion to receive IF circuit 20 and also for supplying the carrier frequency to transmit and gain control circuit 14.

The connection between the transmitter input and the receiver output, that is, with transmitter and gain control circuit 14 and receive IF circuit 20, with dual quad diode mixer circuit 15, is through a common terminal line circuit 23 to a quad diode mixer circuit 24 connected for receiving frequency input signals from multifrequency oscillator circuit 25. Diode mixer circuit 24 is connected through filter 26 to a second quad diode mixer circuit 27, connected for receiving frequency input signals from oscillator circuit 28. Mixer 27 is connected by a common terminal line circuit 29 to transmit amplifier 16 and receive amplifier 21.

Referring also to FIGURE 2, the common terminal line circuit 23 is connected to quad diode mixer circuit 24 through associated circuitry including a common circuit 23 connection to capacitors 30 and 31, the other plates of which are connected respectively to opposite ends of a coil 32 of a signal coupling transformer 33. The common connection between capacitor 30 and an end of coil 32 is also connected to ground. The other coil 34, of signal coupling transformer 33, has a center tap connection 35 to ground and has opposite ends connected to terminals 36 and 37 of the four diode bridge in the quad diode mixer circuit 24. The diodes **38*a*, 38*b*, 38*c*, and 38*d* are interconnected cathode to anode around the bridge circuit with terminal 36 being a common connection between the anode of diode 38*a* and the cathode of diode 38*d* and with the terminal 37 being the common connection between the cathode of diode 38*b* and the anode of diode 38*c*. The other two terminals of the four diode bridge, terminal 39, a common connection between the cathode of diode 38*c* and the anode of diode 38*d* and terminal 40, a common connection between the cathode of diode 38*a* and the anode of diode 38*b*, are connected to opposite ends of coil 41 of signal coupling transformer 42**.

Coil 41 is provided with a center tap connection 43 through a capacitor 44 with a signal frequency source oscillator 25. The ends of the other coil 45 of signal coupling transformer 42 is connected to and through filter 26 to the opposite ends of coil 46 of signal coupling transformer 47. The filter 26 includes: a common connection to ground for one end of each of the coils 45 and 46, a connection through capacitor 48 between the other ends of the coils 45 and 46, and capacitors 49 and 50 connected between respective common connections between capacitor 48 and coils 45 and 46 and ground, respectively.

Coil 51, of signal coupling transformer 47, is provided with a center tap connection 52 through a capacitor 53 with a signal frequency source oscillator 28. The opposite ends of coil 51 are connected to terminals 54 and 55 of the four diode bridge in the quad diode mixer circuit 27. The diodes 56*a*, 56*b*, 56*c*, and 56*d* are interconnected cathode to anode around the bridge circuit with terminal 54 being a common connection between the cathode of diode 56*c* and the anode of diode 56*d* and with the terminal 55 being the common connection between the cathode of diode 56*a* and the anode of diode 56*b*. The other two terminals, of the four diode bridge, terminal 57, a common connection between the cathode of diode 56*d* and the anode of diode 56*a*, and terminal 58, a common connection between the cathode of diode 56*b* and the anode of diode 56*c* are connected to opposite ends of a coil 59, with a center tap connection 60 to ground, of signal coupling transformer 61. The other coil 62 of signal coupling transformer 61 is connected in parallel with capacitor 63 between ground and common terminal line circuit 29.

In a working embodiment of the invention the diode bridges of the two diode quad balanced mixer circuits 24 and 27 have been made up of matched sets of, for example, silicon diodes, type FA 4000 supplied by the Fairchild Camera and Instrument Corporation. These were incorporated in a duel quad diode mixer circuit 15 used to translate the IF frequency by 100 cycles per second, incremental tuning steps, although, obviously, other relatively small frequency incremental tuning steps could be employed. The circuit was employed in a transceiver requiring that the IF frequency be translated to a lower frequency during transmit and to a higher frequency during receive, a requirement taking advantage of the balanced diode quad mixers being bilateral in using them in both directions, one direction for transmit, the other for receive, thereby eliminating their duplication for both the transmit and receive functions.

Operation of this circuit may be best illustrated by an example. Assume the desired RF tuner transmitting and receiving operating frequency is 14,500.3 kc. and the IF frequency is 300 kc., as determined by the 300 kc. carrier frequency source 22 and by fixed filters in the IF amplifiers of the transceiver. Normally, without the inclusion of the dual quad diode mixer 0.1 kc. tuning module 15, the RF tuner would translate a received signal at 14,500.0 kc. to 300 kc. for IF amplification. In the transceiver used with the frequency translation processes of the RF tuner the sidebands of the received signal are inverted, that is, signals above 14,500.0 kc. will be below 300 kc. after translation and frequencies below 14,500.0 kc. will be above 300 kc. after translation. Thus, if it is desired to receive, and if in fact a signal is being received at 14,500.3 kc. as the center frequency, the RF tuner IF output frequency will be at 299.7 kc., a frequency that must be translated to 300 kc. for proper IF amplifiaction in receiver IF staging, a translation that is quite conveniently accomplished by the dual balanced quad diode mixer circuit 15. Obviously, the situation is quite similar for the transmitting mode of operation. All transmitted signals are generated with a center IF frequency of 300 kc. and if the desired operational output frequency from RF tuner 17 is to be 14,500.3 kc., the IF center frequency must be translated to 299.7 kc. before translation to the higher output frequency by the RF tuner.

In a working embodiment, oscillator circuit 25 is a multiselective frequency oscillator signal source with selective crystal controlled frequencies by 100 cycle per second steps from 212.1 kc. through 213.0 kc. In the working embodiment, filter 26 is a 513 kc. filter with capacitor 48 a 39 picofarad capacitor and with capacitors 49 and 50 being 560 picofarad capacitors. With this frequency translating circuit, a received signal of 14,500.3 kc. is translated by the RF tuner 17 to 299.7 kc., mixed with a 213.0 kc. input from oscillator circuit frequency source 28 in mixer 27, filtered at 512.7 kc., and mixed in mixer 24 with 212.7 kc. as the selected frequency input from multiselective frequency oscillator frequency source 25 to provide a 300 kc. output signal fed to receive IF circuitry 20.

The frequency translation scheme of the 0.1 kc. incremental tuning dual balanced quad diode mixer circuit 15 is very versatile and could accommodate a system where the sidebands are not inverted in the RF tuner 17 simply by changing connections to various crystals and oscillators in the system. If this were the case with sidebands not inverted, with reference to the operational illustration immediately above, the received signal would be translated to 300.3 kc., mixed with a 212.1 kc. frequency supplied from oscillator frequency source 28 in mixer 27, filtered at 512.4 kc., and then mixed with a 212.4 kc. input from the multiselective frequency oscillator 25 in mixer 24 to provide an output IF frequency of 300 kc. to receive IF staging 20. It should also be noted that a system utilizing only six crystals as opposed to ten crystals with both oscillator frequency sources 25 and 28 being multiselective frequency sources, each having three crystal controlled selective frequencies may be used.

To further illustrate the insertion frequencies employed for operation of the step frequency translating circuit 15, and some other possible frequency scheme combinations usable with such a step frequency translator circuit, refer to the table below:

| Selected Frequency Translation Position | Oscillator 25 Ten Crystal Translation Frequencies, and Alternate Mode 212.1 kc. or 213.0 kc. Oscillator 28 Frequencies | | | | Six Crystal Frequency Translating Scheme with Three Selective Incremental Tuning Frequency Crystals in Both Oscillators 25 and 28 | | | |
|---|---|---|---|---|---|---|---|---|
| | Sidebands Inverted | | Sidebands Not Inverted | | Sidebands Inverted | | Sidebands Not Inverted | |
| | Osc. 28 $f_1$ | Osc. 25 $f_2$ | Osc. 28 $f_1$ | Osc. 25 $f_2$ | Osc. 28 $f_1$ | Osc. 25 $f_2$ | Osc. 28 $f_1$ | Osc. 25 $f_2$ |
| 0 | 213.0 | 213.0 | 212.1 | 212.1 | 212.4 | 212.4 | 212.4 | 212.4 |
| 1 | 213.0 | 212.9 | 212.1 | 212.2 | 212.4 | 212.3 | 212.3 | 212.4 |
| 2 | 213.0 | 212.8 | 212.1 | 212.3 | 212.4 | 212.2 | 212.2 | 212.4 |
| 3 | 213.0 | 212.7 | 212.1 | 212.4 | 212.4 | 212.1 | 212.1 | 212.4 |
| 4 | 213.0 | 212.6 | 212.1 | 212.5 | 212.7 | 212.3 | 212.3 | 212.7 |
| 5 | 213.0 | 212.5 | 212.1 | 212.6 | 212.7 | 212.2 | 212.2 | 212.7 |
| 6 | 213.0 | 212.4 | 212.1 | 212.7 | 212.7 | 212.1 | 212.1 | 212.7 |
| 7 | 213.0 | 212.3 | 212.1 | 212.8 | 213.0 | 212.3 | 212.3 | 213.0 |
| 8 | 213.0 | 212.2 | 212.1 | 212.9 | 213.0 | 212.2 | 212.2 | 213.0 |
| 9 | 213.0 | 212.1 | 212.1 | 213.0 | 213.0 | 212.1 | 212.1 | 213.0 |

NOTE.—The above frequency values are in kc.'s and the position number equals the difference between the kc. frequencies of $f_1$ and $f_2$ in 100's of cycles per second.

Whereas this invention is here illustrated and described with respect to a specific embodiment thereof, it should be realized, particularly with the various frequency permutations pointed out in the specification and as particularly illustrated in the table set forth above, that various changes may be made without departing from the essential contribution to the art made by the teachings hereof.

We claim:

1. A bilateral direction signal transmitting dual bridge-oscillator frequency translator circuit having opposite end dual signal direction terminals and capable of translating frequency signals applied at one of the terminals and passed through the circuit in one direction to higher frequencies by frequency tuning variations and for translating frequencies applied at the other end terminal and passed through the circuit in the opposite direction, frequency translation in the opposite direction to lower frequencies by frequency tuning variations including: said opposite end terminals; at least two bridge circuits; signal coupling means between each of the opposite end terminals and the respective said bridge circuits; filter means and signal frequency coupling means interconnecting said bridge circuits; a plurality of signal frequency reference sources; individual respective units of said plurality of signal frequency reference sources being connected to supply a reference frequency input to each of said bridge circuits; and at least one of said plurality of signal frequency reference sources being a variable frequency source.

2. The bilateral direction signal transmitting dual bridge-oscillator frequency translator circuit of claim 1, wherein said bridge circuits are four diode balanced bridge circuits each including four diodes interconnected cathode to anode around the respective bridge circuit, and four terminals one each at each bridge interconnection between diodes.

3. The bilateral direction signal transmitting dual bridge-oscillator frequency translator circuit of claim 2, wherein the filter means and signal frequency coupling means interconnecting said bridge circuits includes two coils each having its opposite ends connected to two opposite terminals of the four terminals of the respective said bridge circuit; and with the connection of the respective said signal frequency reference sources to supply a reference frequency input to each of said bridge circuits being, respectively, a tap connection with the said coil connected to the respective bridge circuit.

4. The bilateral direction signal transmitting dual bridge-oscillator frequency translator circuit of claim 3, wherein each of said signal frequency reference sources connected to supply a reference frequency input to the respective bridge circuits are capable of providing predetermined reference frequencies; and wherein said filter means is constructed with component values providing a filter passing the sum of the reference frequency applied from the respective said signal frequency reference source connected to one of said bridge circuits and a frequency signal input applied to one of said opposite end terminals.

5. The bilateral direction signal transmitting dual bridge-oscillator frequency translator circuit of claim 3, wherein each of said two coils is a coil of a respective signal frequency coupling transformer; and with said filter means interposed between and interconnecting said signal frequency coupling transformers.

6. The bilateral direction signal transmitting dual bridge-oscillator frequency translator circuit of claim 5, wherein said signal coupling means between each of the opposite end terminals and the respective said bridge circuits includes a signal frequency coupling transformer at each location, each having a coil connected for signal communication with the respective end terminal and with each of said transformers having a center tap grounded coil with opposite ends directly connected to the other opposite terminals of the four terminals of the respective bridge circuit.

7. In a radio frequency transceiver system including an RF tuner portion, a transmitter section and a receiver section, carrier frequency source means connected to each the receiver IF section and the transmitter section and means for switching between the receiver section and transmitter section for operation in the transmitting mode of operation and the receive mode of operation, a bilateral direction signal transmitting dual bridge frequency translating circuit having opposite end dual signal direction terminals with one end connected to the RF tuner portion of the transceiver and the other end terminal connected to said receiver section and to said transmitter section and capable of translating frequency signals applied at one of the terminals and passed through the circuit in one direction in one mode of transceiver operation to higher frequencies by incremental frequency tuning steps and for translating frequencies applied at the other end terminal and passed through the circuit in the opposite direction in the other mode of transceiver operation, frequency translation in the opposite direction to lower frequencies by incremental frequency tuning steps including: a plurality of bridge circuits; signal coupling means between each of the opposite end terminals and respective units of said bridge circuits respectively; filter means and signal frequency coupling means interconnecting said bridge circuits; a plurality of signal frequency reference sources; individual respective units of said plurality of signal frequency reference sources being connected to supply a reference frequency input to each of at least two of said bridge circuits; and at least one of said plurality of signal frequency reference sources being a multiselective frequency source.

8. In the bilateral direction signal transmitting dual bridge-oscillator frequency translator circuit of claim 7, wherein at least two of the plurality of bridge circuits are four diode balanced bridge circuits each including four diodes interconnected cathode to anode around the respective bridge circuit, and four terminals one each at each bridge interconnection between diodes; and including two signal frequency coupling transformers directly connected to respective opposite sets of terminals of said four terminals with each of the respective four diode bridges; with each coupling transformer having a tapped coil directly connected to the respective four diode bridge, one tap being connected to ground and the other tap being connected to one of the plurality of signal frequency reference sources, respectively.

References Cited

UNITED STATES PATENTS

| | | | |
|---|---|---|---|
| 2,373,569 | 4/1945 | Kannenberg | 332—47 X |
| 2,511,468 | 6/1950 | Harrison | 332—47 X |
| 2,902,596 | 9/1959 | Rockwell et al. | 325—25 X |
| 2,922,960 | 1/1960 | Stachiewicz | 332—47 |
| 2,927,321 | 3/1960 | Harris. | |
| 3,005,163 | 10/1961 | Dulberger et al. | |
| 3,229,122 | 1/1966 | Engle | 332—47 X |

JOHN W. CALDWELL, *Acting Primary Examiner.*